(12) United States Patent
Chiolerio et al.

(10) Patent No.: US 10,800,552 B2
(45) Date of Patent: Oct. 13, 2020

(54) PROPULSION APPARATUS FOR SPACE VEHICLES AND CORRESPONDING METHOD

(71) Applicant: FONDAZIONE ISTITUTO ITALIANO DI TECNOLOGIA, Genoa (IT)

(72) Inventors: Alessandro Chiolerio, Genoa (IT); Samuele Porro, Genoa (IT)

(73) Assignee: FONDAZIONE ISTITUTO ITALIANO DI TECNOLOGIA, Genoa (IT)

( * ) Notice: Subject to any disclaimer, the term of this patent is extended or adjusted under 35 U.S.C. 154(b) by 330 days.

(21) Appl. No.: 15/777,379

(22) PCT Filed: Nov. 30, 2016

(86) PCT No.: PCT/IB2016/057210
§ 371 (c)(1),
(2) Date: May 18, 2018

(87) PCT Pub. No.: WO2017/093906
PCT Pub. Date: Jun. 8, 2017

(65) Prior Publication Data
US 2020/0277088 A1 Sep. 3, 2020

(30) Foreign Application Priority Data

Dec. 4, 2015 (IT) .................. 102015000065421

(51) Int. Cl.
*B64G 1/40* (2006.01)
*F03H 1/00* (2006.01)

(52) U.S. Cl.
CPC ........... *B64G 1/405* (2013.01); *F03H 1/0037* (2013.01)

(58) Field of Classification Search
CPC ........ B64G 1/405; B64G 1/409; F03H 1/0037
See application file for complete search history.

(56) References Cited

U.S. PATENT DOCUMENTS

| 2011/0227022 A1 | 9/2011 | Cho | |
|---|---|---|---|
| 2017/0074252 A1* | 3/2017 | Madigan | ............... B64G 1/405 |
| 2018/0283365 A1* | 10/2018 | John | ...................... B64G 1/405 |

(Continued)

OTHER PUBLICATIONS

Patent Cooperation Treaty, Notification of Transmittal of the International Search Report and the Written Opinion of the International Searching Authority, or the Declaration for PCT/IB2016/057210, dated Mar. 21, 2017, 13 pages.

(Continued)

*Primary Examiner* — Brian M O'Hara
(74) *Attorney, Agent, or Firm* — Heslin Rothenberg Farley & Mesiti P.C.; Victor A. Cardona, Esq.

(57) ABSTRACT

A propulsion apparatus for space vehicles, includes a solid state oxygen-rich source layer, means for extracting oxygen from said solid state oxygen-rich source layer, means for accelerating correspondingly extracted oxygen ions into vacuum. A stack includes the solid state oxygen-rich source layer, an active layer being deposited above the solid state oxygen-rich source layer, in contact with the solid state oxygen-rich source layer, the active layer being formed with a material different from the solid state oxygen-rich source layer, the material being an oxide presenting impedance hysteresis behavior.

16 Claims, 3 Drawing Sheets

(56) References Cited

U.S. PATENT DOCUMENTS

2019/0135457 A1* 5/2019 Lozano ................ F03H 1/0012
2019/0168895 A1* 6/2019 Conversano .......... F03H 1/0075
2020/0156809 A1* 5/2020 Hey ...................... B64G 1/402

OTHER PUBLICATIONS

Reppin, D., et al., "Concepts for micro-thrusters based on solid state ion conductors", IEPC-2013-128, Presented at the 33rd International Electric Propulsion Conference, The George Washington University, Washington, D.C., USA, Oct. 6-10, 2013.

Seo, D., et al., "The development of the micro-solid propellant thruster array with improved reliability", Journal of Micromechanics & Microengineering, Institute of Physics Publishing, Bristol, Great Britain, vol. 22, No. 9, Aug. 24, 2012, p. 94004.

Rossi, C., et al., "Matrix of 10x10 addressed solid propellants microthrusters: Review of the technologies", Sensors and Actuators A: Physical, vol. 126, Issue 1, pp. 241-252 (2006).

\* cited by examiner

PROPULSION APPARATUS FOR SPACE VEHICLES AND CORRESPONDING METHOD

CROSS REFERENCE TO RELATED APPLICATIONS

This application is a national stage filing under section 371 of International Application No. PCT/IB2016/057210, filed on Nov. 30, 2016, published in English on Jun. 8, 2017 as WO2017/093906A1 and which claims priority to Italian Application No. 102015000065421, filed on Dec. 4, 2015, the entire disclosure of these applications being hereby incorporated herein by reference.

TECHNICAL FIELD

The present description relates to techniques for propelling vehicles in vacuum, particularly in space, by a propulsion apparatus for space vehicles, comprising an oxygen-source layer, means for extracting oxygen from said oxygen-source layer, means for accelerating correspondingly extracted oxygen ions into vacuum.

DESCRIPTION OF THE PRIOR ART

The possibility to correct the attitude and/or altitude of small space vehicles, e.g. nano-satellites, by means of an internal propulsion system, is a characteristic that is increasingly required for advanced space missions. The propulsion of microsatellites is normally studied and achieved by means of miniaturized propulsion systems, which can generate acceleration (thrust) usually by ejecting part of their mass. Regarding nano-satellites and smaller systems, there is actually no solution for their propulsion, while some proposals rely either on electro-dynamic systems (which are limited to a region of the earth magnetic field where flux density is high enough) or on solar sails. There are several ways to generate thrust, which work following different principles. For instance, electric power can be used to generate heat and vaporize a liquid or a solid propellant, which is accelerated through a nozzle. The same principle is applied using vapor bubbles. Colloid thrusters produce thrust by the electrostatic acceleration of liquid droplets forming an electrostatic spray. In pulsed-plasma thrusters an arc is used to ablate and accelerate a small amount of solid propellant. Laser-driven micro-rockets use short laser pulses to ablate a small amount of material and obtain thrust.

Another class of mechanisms uses gas or liquid propellant which is stored at high pressure, for example in cold gas propulsion systems.

In the easiest configuration, a cold gas blow-down rocket engine typically consists of a gas tank, a pressure and temperature sensor, an on/off valve and a thruster. These micro-propellers or micro-thrusters are realized with standard MEMS technology and are extremely complex devices, based on gas ejection and subsequently subject to erosion. In particular, the fabrication of micro-valves suitable for micro propulsion purposes is technologically challenging because these structures need to be very leak-tight in the closed state, and in the open state the resistance to the gas flow has to be very low. These two requirements combined are very hard to meet. A high leak rate causes undesired disturbance torques and deviations in altitude, significantly shortening the duration of a mission. This fundamental issue is further enhanced when downsizing the dimension of the valve, in order to comply with the raising demand of miniaturization of components.

The publication by D. Reppin, F. Kuhl, M. Piechotka, T. Henning, P. J. Klar, N. Wolf, S. Kolling and J. Janek "Concepts for micro-thrusters based on solid state ion conductors", IEPC-2013 Proceedings, (2013) IEPC-2013-128 discloses two solutions for electric micro-propulsion thrusters based on the solid state ion conductor yttria stabilized zirconia (YSZ). One of the solutions is based on microfabricated YSZ membranes where oxygen from the gas phase out of a reservoir is incorporated in the form of ions at the YSZ surface and conducted through the membrane to the opposite surface where it is extracted as ions O– and accelerated into vacuum. The other approach is based on an oxygen-source thick YSZ film where the excess oxygen is extracted from the layer and accelerated into vacuum.

In this case in the first configuration the oxygen reservoir is in the liquid state, this feature leading to some important drawbacks concerning the difficulty in the storage and the dangerousness of the material itself. In the second configuration, the active layer of YSZ acts also as oxygen reservoir, leading to difficulties in precise control on the available oxygen quantity and in precise control on the propulsion mechanism based on oxygen ions. Moreover the solution with the solid reservoir in order to operate needs to bring the YSZ to about 1000 K, i.e. needs to work at high temperatures at which YSZ is permeable to oxygen, generating drawbacks in terms of reliability, as well as the cost, overall dimensions and consumption.

This document discloses in the second configuration a space thruster, including an oxygen reservoir, that accelerates oxygen ions in order to generate propulsion, i.e. a propulsion apparatus for space vehicles according to the preamble of claim 1.

OBJECT AND SUMMARY

An object of one or more embodiments is to overcome the limitations inherent to the solutions achievable from the prior art.

According to one or more embodiments, that object is achieved thanks to a propulsion apparatus having the characteristics specified in claim 1. One or more embodiments may refer to a corresponding method of propulsion and also to a manufacturing process of a thruster.

The claims form an integral part of the technical teaching provided herein in relation to the various embodiments.

According to the solution described herein, the propulsion apparatus comprises a stack including said solid state oxygen-rich source layer, an active layer being deposited above said solid state oxygen-rich source layer, in contact with said solid state oxygen-rich source layer, said active layer being formed with a material different from said solid state oxygen-rich source layer, said material being an oxide featuring impedance hysteresis behavior.

In various embodiments, the active material is comprised between two metallic layers, an intermediate metallic layer arranged on the solid state oxygen-rich layer and a top metallic layer, arranged on the active layer.

In various embodiments, the intermediate metallic layer and top metallic layer comprise a plurality of parallel strips, in particular two strips each, the strips of the intermediate metallic layer being arranged orthogonal to the strips of the top metallic layer, in particular in a crossbar array arrangement.

In various embodiments, the strips of said intermediate metallic layer and top metallic layer arranged orthogonal form crossings and comprise respective passing bores obtained in correspondence of one or more of said crossing, forming an output duct for oxygen ions emitted by the active layer.

In various embodiments, the apparatus comprises nozzles placed above the bores of the top metallic layer.

In various embodiments, the apparatus comprises an ion accelerating element placed above the nozzles, in particular an acceleration metallic grid electrically driven.

In various embodiments, the apparatus comprises a heating electrode associated to the solid state oxygen-rich layer.

The solution described herein is also directed to a method for propelling an object in vacuum, using a thruster according to any of the above described embodiments.

In various embodiments, the method includes heating the solid state oxygen rich layer to diffuse oxygen into the active layer for a given time;

generating a series of pulses at a voltage set level, in order to bring a resistance of the active layer in the low resistance state and expel oxygen ions through the active layer;

generating a series of pulses at a reset voltage level to switch back to the high resistance layer the active layer to cease expelling oxygen ions.

The solution described herein is also directed to a manufacturing process of one or more thrusters of a propulsion apparatus according to any of the above described embodiments, comprising depositing a back electrode on a substrate as heating electrode, then depositing an oxygen-rich solid-state reservoir layer over the back electrode, depositing the intermediate metallization layer above the solid state oxygen-rich source layer, in particular as bottom electrodes of a CPE (Cross-Point Electrode) system, comprising passing holes, then depositing the active layer of an oxide which features a impedance hysteresis behaviour, subsequently depositing the topmost metallization electrodes with holes in correspondence of crossings with the bottom electrodes, depositing a sacrificial portion and subsequently etch said sacrificial portion to manufacture expansion nozzles around the holes, the method in particular further including positioning an energy enhancing element above the nozzles.

BRIEF DESCRIPTION OF THE DRAWINGS

The embodiments will now be described purely by way of a non-limiting example with reference to the annexed drawings, in which.

DETAILED DESCRIPTION OF EMBODIMENTS

Figure 1:
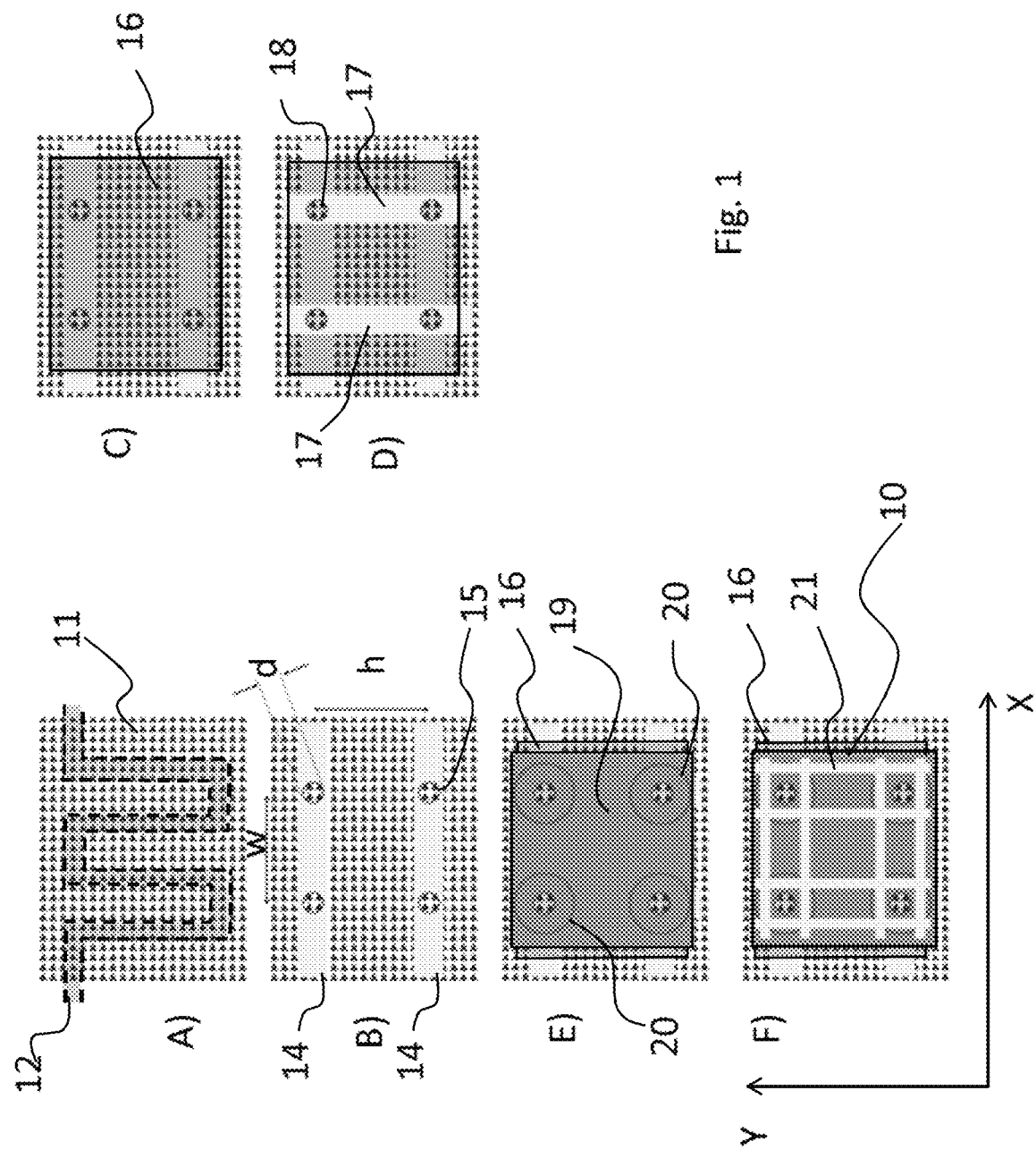
FIGS. 1A-1F represent steps a manufacturing process of an apparatus according to one embodiment from a top view.

The ensuing description illustrates various specific details aimed at an in-depth understanding of the embodiments. The embodiments may be implemented without one or more of the specific details, or with other methods, components, materials, etc. In other cases, known structures, materials, or operations are not illustrated or described in detail so that various aspects of the embodiments will not be obscured.

Reference to "an embodiment" or "one embodiment" in the framework of the present description is meant to indicate that a particular configuration, structure, or characteristic described in relation to the embodiment is comprised in at least one embodiment. Likewise, phrases such as "in an embodiment" or "in one embodiment", that may be present in various points of the present description, do not necessarily refer to the one and the same embodiment. Furthermore, particular conformations, structures, or characteristics can be combined appropriately in one or more embodiments.

The references used herein are intended merely for convenience and hence do not define the sphere of protection or the scope of the embodiments.

The solution here described is based on a stack, which is included in a thruster to release oxygen in vacuum, in which there is a oxygen-source layer and an active layer deposited above the oxygen-source layer so that it is in contact with said oxygen-source layer. The active layer is formed with a material which is different with respect to that said oxygen-source layer and it is specifically an oxide presenting impedance hysteresis behavior, i.e., as non limiting example, a resistive switching material, also known as memristor or resistor with memory. Also the oxide material can be an oxide material used in memcapacitors or meminductors.

Impedance, or resistive, switching materials present two stable impedance or resistance levels controlled by applied electrical voltage or current. For instance transition metal oxide ultrathin active layers, deposited by way of example by means of Atomic Layer Deposition (ALD), are able to switch from a High Resistance State (HRS) to a Low Resistance State (LRS) by the formation of conductive bridges (either oxygen vacancies or metal ions diffusing from the contacts) across the oxide thin film. To the best knowledge of the inventors, the drift/diffusion of oxygen vacancies (or anions) driven by an electric field and/or thermochemical reduction/oxidation plays a key role in this process. Normally, the electrically operated switching requires from 1 ms down to 1 ns, and each device may withstand up to 1012 cycles before failure. During the formation of the oxygen vacancy filament across the oxide layer, oxygen atoms are expelled from the thin film. This phenomenon produces clearly visible oxygen bubbles, whose position corresponds to the active junction area, trapped below the top metal layer. The amount and rate of gas expulsion can be electrically controllable at the nearly-atomic scale, thus in a vacuum-like environment can be exploited in the fabrication of a propulsion system for very small objects.

Therefore, the solution here described provides using in a propulsion system for small object, i.e. femto-satellites and pico-satellites, hence it is called also a femto-propeller, an architecture of an active layer arranged as resistive hysteresis device cross-bar arrays and also provides to include, under said active layer arranged as a cross-bar array, an oxygen-source sub-layer that is used to restore the operability of the propeller, in particular the thruster, between subsequent firings. Also, according to another aspect, the solution provides a nozzle, carved from the active layer using standard MEMS processing, so that, instead of generating an oxygen bubble trapped between the active layer and the top electrode, the expelled gas is free to expand in such a nozzle.

The process of manufacturing 100 of a propulsion apparatus 10 will be now described with reference to FIGS. 1 and 2.

In FIG. 1 it is described the flow of a process of manufacturing of a propulsion apparatus 10 in the form of a cell of thrusters 30, in particular four thrusters 30, according to the described solution. FIGS. 1A to 1F represent different steps of the process from a top view, in a X-Y plane.

Figure 2:
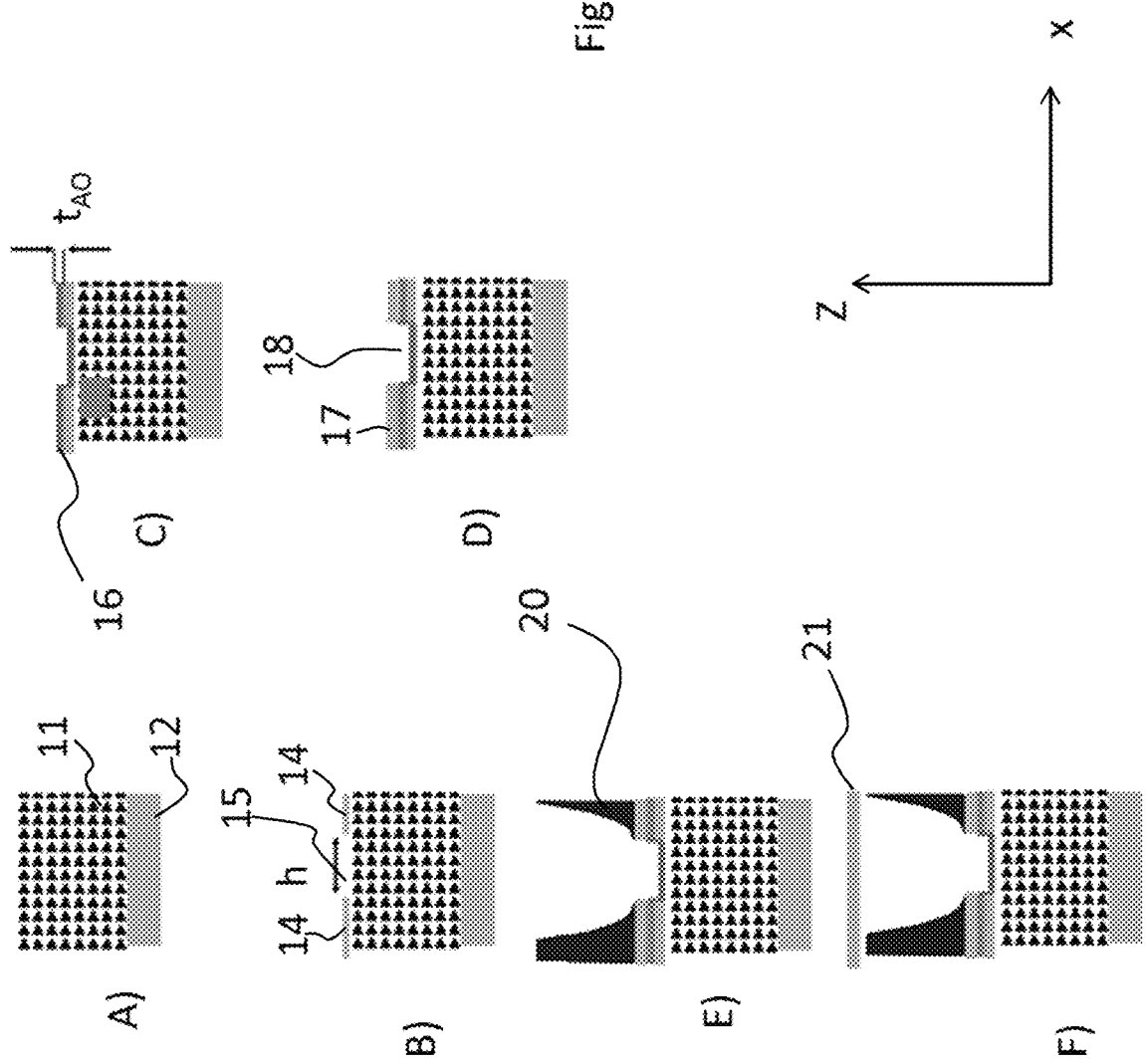
FIGS. 2A-2F represent the same steps of the manufacturing process of FIGS. 1A-1F through a partial lateral section.

In FIG. 2 it is described the flow of a process of manufacturing of the cell 30 from a lateral view. FIGS. 2A-2F show the same steps of FIG. 1A-1F in a lateral view, along horizontal axis X, while axis Z is the depth layer which goes through the stack of different layers of the cell. FIG. 2 shows only a detail, in particular one electrode 14 of a thruster 30 and a corresponding hole 15, which represent the exit hole of the thruster 30, as better detailed in the following.

The process workflow may start from the substrate, for instance a mono-crystalline slice of semiconductor, such as silicon or silicon carbide, providing thermo-mechanical stability for the subsequent parts. Such mechanical substrate on which a cell 10 of thrusters 30 lies is not shown for simplicity.

Thus in FIG. 1A, the process starts from a situation in which a back electrode 12 has been deposited in a previous step on a substrate and then a solid state oxygen-rich source layer 11 has been deposited in a subsequent step over the back electrode 12. The back electrode 12 is used for the heating of the solid state oxygen-rich source layer 11, i.e. the oxygen reservoir, and is preferably in the form of a bottom grid or meandering layer of metallic electrodes, obtained for example by means of thermal evaporation/sputtering of any metal (Au, Cu, Cr, Ti, Al, Pt), preferentially with a low affinity to oxygen and with a low density, for allowing the heating of the reservoir layer 11 and oxygen back diffusion.

The reservoir layer 11 is obtained by deposition of either peroxides or superoxides (e.g. K2O or LiClO4), preferentially any material showing an oxygen weight percentage higher than 50% and preferentially non explosive and easily controllable, such as potassium superoxide or lithium perchlorate. The thickness of the solid state oxygen-rich source layer 11 is determined depending on the amount of firings expected during the propeller life and impulse requirements, ranging from tens of nm to hundreds of µm.

In FIG. 1B it is then shown a step of deposition of an intermediate metallization layer, which includes bottom electrodes 14, deposited above the layer 11, of a CPE (Cross-Point Electrode) system, in form of two parallel metallic strips. Two passing holes 15 with a diameter d, slightly smaller than the width of the strip, are obtained in each strip, equidistant from the strip's ends and at a distance w one with respect to the other. The strip in the example is approximately two times the distance w in length. The CPE geometry is preferably used for the electrodes since the propeller needs quite high electric fields. The CPE geometry as a whole involves the deposition of the intermediate metallization layer, with techniques and with materials analogous to those described for the back electrode 12, then the deposition of an active layer 16, and of a topmost metallization electrode 17, also with techniques and with materials analogous to those indicated for the deposition of the back electrode 12 and the bottom electrodes 14 of the intermediate metallization layer. As shown with reference to FIGS. 1D and 2D, the geometry of the topmost metallization electrode 17 is compatible with the design of engraved nozzles 20, as it can be seen in FIGS. 1D and 2D, i.e. the electrodes 17 are also metallic strips, in particular two metallic strips in FIGS. 1D, 2D substantially having the same shape and size of the electrodes 14, arranged orthogonal with respect to strips 14, in a crossbar array fashion, crossing the strips 14 in correspondence of the holes 15 and having holes 18 in correspondence of such crossings. In other word, holes 15 and 18 are aligned forming an output duct for the oxygen ions coming from the active layer 11.

As already mentioned, bottom electrodes 14 are two parallel rectangular metal strips comprising holes 15 in the direction of the horizontal axis X, in particular in this case two holes on each electrode 14, having a diameter d. A width w of the cell 10 is the distance between the holes 15 on a same strip, while a height h of the cell 10 is the distance between two holes 15 on two different electrodes at the same horizontal coordinate X, i.e. a distance along vertical axis Y. The width w is preferably approximately equal to the height h, so that the holes 15 which correspond to the thrusters 30 are the vertices of a square. The size of the cell 10 can be typically in the range 1 µm<w≈h<1 mm, i.e. an area of between 1 µm2 and 1 mm2, the width w and the height h being circa the same and comprised between 1 micrometer and 1 millimeter.

In FIG. 1C it is shown the deposition step, by way of example by ALD (Atomic Layer Deposition) technique, of an active layer 16 able to eject oxygen ions, by way of examples a layer of oxides such as ZnO or titanates such as SrTiO3 or any other complex oxide which features a memristive behaviour, i.e., a resistive switching material.

The active layer 16 shown in FIG. 2C has a thickness tAO, along the direction of depth axis Z, of some tens of nm, with a typical thickness 10 nm<tAO<50 nm. Such small values of thickness enable the development of extremely high electric fields for the extraction of oxygen ions, using, as indicated also above, transition metal oxides, i.e. ZnO, TiO2, TaOx, and so on, or in alternative titanates as SrTiO3, or any other complex oxide featuring memristive behavior. From FIG. 2C it can be seen also that the active layer 16 is in direct contact with the oxygen source, or reservoir, layer 11.

In FIG. 1D it is shown the deposition of top electrodes 17 of the CPE system (as better seen in FIG. 2D).

In FIG. 1E it is shown the deposition step of a sacrificial portion 19, i.e. a resin layer, which is subsequently etched to manufacture expansion nozzles 20 around the holes 15.

An ion bombardment process (or any other wet/solid etching procedure) is used to obtain the nozzles 20, exposing the active layer 16 and making effective the oxygen ejection, expansion and impulse transfer to the system. In variant embodiments, according to the external conditions, it is possible to couple the chip on which the propeller 10 is obtained with a polymeric array of nozzles, providing the correct curvature for the gas expansion. From FIG. 2E it can be appreciated the parabolic shape of the expansion nozzle 20, which is obtained by etching the sacrificial resin layer 19 by ion bombardment.

In FIG. 1F it is shown a step of positioning of an energy enhancing element, an acceleration grid 21, providing an additional energy transfer to the ejected ions. The active area of the nozzle 20 is extremely small: 100 nm<w≈h<100 µm.

The acceleration grid 21 supplies an electrically driven enhancement of the energy of the expelled oxygen ions. The ions are electrically charged and will be repelled by a field of the same sign. In variant embodiments, the energy enhancing element can be a magnetically driven one, since oxygen ions carry also an unbalanced spin.

Thus, based on the above, in one embodiment a manufacturing process of one or more thrusters 30 of a propulsion apparatus 10 comprises the steps of depositing a back electrode 12 on a substrate as heating electrode, then depositing a solid state oxygen-rich source layer 11 over the back electrode 12, depositing the intermediate metallization layer 14 above the solid state oxygen-rich source layer 11, in particular as bottom electrodes of a CPE (Cross-Point Electrode) system, comprising passing holes 15, then depositing the active layer 16 of an oxide which features a memristive behaviour.

subsequently depositing the topmost metallization electrodes 17 with holes 18 in correspondence of crossings with the bottom electrodes 14, depositing a sacrificial portion 19 and subsequently etch said sacrificial portion 19 to manufacture expansion nozzles 20 around the holes 15.

Also in varying embodiments the manufacturing method further comprises positioning an energy enhancing element 21 above the nozzles 20.

Figure 3:
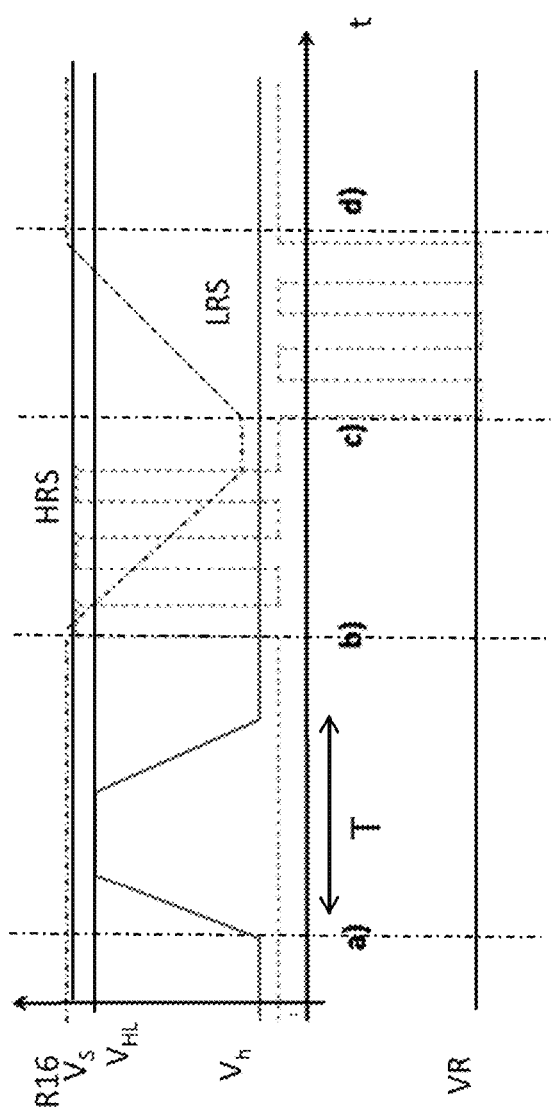
FIG. 3 represents a time diagram of signals employed to drive an apparatus according to one embodiment.

In FIG. 3 it shown a complete thruster 30 in lateral view. In FIG. 3 only the acceleration grid 21 is not shown for simplicity, but in variant embodiment can be comprised in such thruster 30.

With 23 is indicated a heater control module, or generator which generates a heating signal Vh applied to the oxygen reservoir heater 12. With 24 is indicated a thrust control generator, which generates a thrust control signal Vt, i.e. a pulsed signal used to operate the thruster 30. Another acceleration control signal is sent from respective control module to drive the acceleration grid 2, but this is not shown in FIG. 3 for simplicity's sake. With 22 are indicated oxygen ions emitted by the thruster 30.

Of course the thruster 30, when manufactured according to the process described with reference to FIGS. 1 and 2 is one of a plurality of thrusters, in particular four thrusters, nevertheless the solution here described extend also to propellers with single thrusters 30, either obtained by an alternate method of manufacturing or by singling out a thruster 30 from a cell 10.

Thus in FIG. 3 it is shown a thruster 30 of a propulsion apparatus 10 comprising a stack including a solid state oxygen-rich source layer 11, an active layer 16 deposited above said oxygen-source layer 11, in contact with the oxygen-rich source layer 11, the active layer 16 being formed with a material different from the oxygen-rich source layer 11, the material being an oxide presenting memristive behavior. The active material 16 is comprised between two metallic layers, an intermediate metallic layer 14 arranged on the oxygen-rich source layer 11 and a top metallic layer, arranged on the active layer 14. The intermediate metallic layer 14 and top metallic layer 17 in an apparatus 10 comprise a plurality of parallel strips, specifically two strips each, the strips of the intermediate metallic layer 14 being arranged orthogonal to the strips of the top metallic layer 17, in particular in a crossbar array arrangement, as also it can be seen in FIGS. 1A-1F. From such figures it can be also seen that the strips of the intermediate metallic layer 14 and top metallic layer 17, arranged orthogonal, form crossings and comprise respective passing bores 15, 18 obtained at one or more of the crossings, forming an output duct for oxygen ions emitted by the active layer 16 for a respective thruster 30. A nozzle 20 can be placed above a respective bore 18 of the top metallic layer 17. As mentioned, an ion accelerating element 21 can be placed above the respective nozzle 20, in particular an acceleration metallic grid 21 electrically driven. Also the apparatus 30 comprise a heating electrode 12 associated to the oxygen-rich source layer 11 to extract the oxygen.

Figure 4:
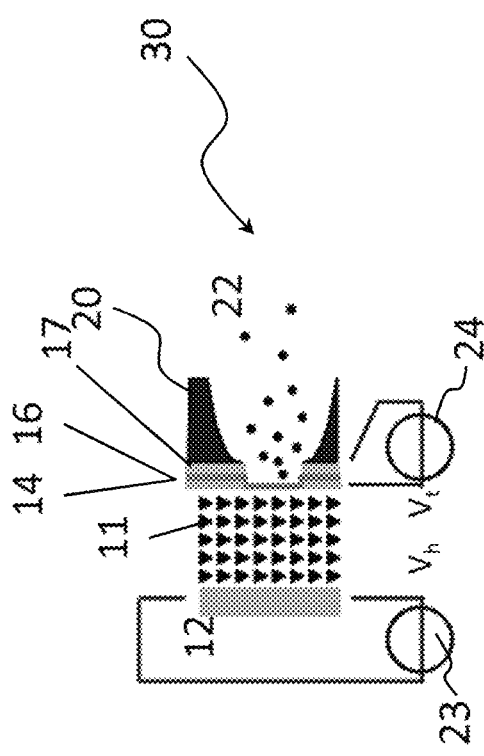
FIG. 4 represents a schematic view of a thruster of an apparatus according to one embodiment here described

In FIG. 4 it is correspondingly shown a time diagram illustrating an embodiment of an operational cycle of the thruster 30 of the propulsion apparatus 10.

Vh indicates the heating signal applied to the oxygen reservoir heater 11. Vt indicates a thrust control signal, i.e. pulsed signal used to operate the thrusters 30. Another signal is sent to drive the acceleration grid, if present, but this is not shown in FIG. 4 for simplicity's sake.

During a firing profile, by way of example, the following events take place in the thruster 30:

the heating of the reservoir 11 starts (phase a), by raising the heating signal Vh to a heating voltage level VHL and oxygen diffuses to the active layer 16 for a time T substantially corresponding to the time for which the heating signal Vh is at the heating voltage level VHL; this step induces some delay, after which the oxygen is back in position in the active layer 16 lattice. The time T may be adjusted, depending on the oxygen depletion level of the thruster 30, by means of a feedback control system and external sensors, in order to increase the stability and reliability of the thruster. Then (phase b) a thruster control unit generates pulses Vt at a voltage set level VS, in order to bring a resistance R16 of the active layer 16 in the LRS; there, oxygen vacancies are present, allowing the conductive path that brings the device resistance to a low level. Consequently, oxygen ions are expelled through the active layer 16 and expand in the nozzle 20. When the desired impulse is reached, pulses are generated (phase c) at the reset voltage level VR (negative in case of a bipolar conduction mechanism) to switch back (phase d) to the HRS the active layer 16 and destroy the oxygen vacancies, reconfiguring the oxygen atoms distribution within the active layer 16. Now a new cycle may start again.

In order to address the performance analysis of the thruster 30, an engineering analysis of current equations describing analogous systems will be performed. The equation used to evaluate an approximate net thrust S of a jet engine (fan based, chemical rocket or electromagnetic plasma) is:

$$S=(p_e-p_n)A_e+\dot{m}_p u_e \quad (1)$$

where the first term is due to the enthalpic pressure drop $(p_n-p_n)$ between the exit of the nozzle 20 and the external environment, times the actual nozzle area $A_e$, and the second term is due to the kinetic energy of the exhaust and its inertial contribution, basically consisting in a mass flow $\dot{m}_p$ times the ejection speed $u_e$.

The exhaust pressure pn of the depleted oxygen can be assumed at least equal to ambient pressure (101,325 Pa), the external pressure $p_e$ is negligible in space vacuum (in the range of 1 nPa), the active area Ae is that of a circle 30 µm in diameter d (although it can be much bigger, up to the millimeter scale, in a engineered prototype). Regarding the kinetic contribution, it can be estimated that the oxygen mass emitted by each cycle is a volume of some picoliters (as a small droplet, and can increase up to some hundreds of picoliters), corresponding to hundreds of femtomol (up to picomol in an engineered prototype). The system should be depleted at a rate depending on the slew rate of the operating voltage, normally in the 1 second range, but in principle it could be as fast as some milliseconds, comparable to the speed of sound in the active solid. The depletion speed, which approximately can be assumed as equal to the ejection speed ue, ranges between 5 to 10 μm/s, in the most conservative case.

Thus, on the basis of equation (1), the value of net thrust S is:

$$S=(1.01325\times10^5-1\times10^{-9})*1\times10^{-8}+5.312\times10^{-37}*1\times10^{-5}\approx1\times10^{-3}N$$

This shows that 1 mN thrust over an area of 100×100 μm is reached by a single thruster 30. When the cross bar array is composed by a square configuration of cells, it is possible to have a global area of 300×300 μm, with four cells, one at each angle of the array.

To estimate the average weight of the thruster 30 it is considered a possible embodiment of the stack, composed by the following structure of layers 12/11/14/16/17: LiClO4 thickness 41000 nm/Ta thickness 20 nm/Pt thickness 50 nm/TaOx thickness 35 nm/Pt thickness 50 nm. The tantalum Ta layer is employed as an adhesion promoter of the Pt layer embodying the electrode 14 on the reservoir 11. The lithium perchlorate LiClO4 layer here is employed in the same time also as substrate 12, not only as reservoir 11, in place of silicon, since a very thick LiClO4 layer is used.

Given the materials densities (2.42 g/cm3 for LiClO4, 16.69 for Ta, 21.45 for Pt and 8.2 for TaOx), it is obtained an estimated cell 10 weight of 2 μg, leading to 500 ng per thruster 30. This means that the thrust to weight ratio (TWR) of the bare propulsion system, excluding control and power generation (that is available onboard for other purposes) is TWR=1×10−3/(9.807*5×10−7)=203.9. It is underlined that the most performing propeller or engine ever realized, a gas-generator cycle kerosene rocket engine named Merlin 1D developed by SpaceX, U.S.A., reaches a value of TWR of 159.9. This makes a propulsor including one or more thruster 30 an effective alternative to other technologies, if scaled toward higher thrusts, as well as the only technology available for the autonomous propulsion and positioning of extremely small satellites and smart dust (swarm) systems.

The estimation of the electrical power needed to fire one single pulse reaching a thrust of 1 mN can be also calculated: this means dissipating roughly 10 mJ for the oxygen expulsion and other 10 mJ during the oxygen restoration cycle, in a total duration of roughly 1 s, so 20 mW of electrical power. Since the amount of oxygen jetted in the space is in the order of 5×10-37 kg/cycle, the energy required per kg of propellant is in the order of 1016 YJ, while the minimum power/thrust is 20 W/N. Regarding the energy per propellant kg, the numbers show that the thruster solution is probably the most efficient mechanism in transferring energy to propellant.

From the last estimate it can be derived the specific impulse $I_{sp}$, according to the following equation (2):

$$F_{thrust}=I_{sp}\dot{m}g_0 \quad (2)$$

where the thrust $F_{thrust}$ [N] is related to the impulse $I_{sp}$ [s] through mass flow rate $\dot{m}$ [kg/s] and gravitational acceleration $g_0$. As already evidenced, impulses as high as $10^{32}$ s are possible, several orders of magnitude better than existing technologies, whose maximum impulse is always smaller than $10^5$ s for dual stage ion thrusters.

The solution according to the various embodiments here described allows to obtain the following advantages.

The apparatus described is a solid state femto-propeller which is entirely electrically driven. The absence of moving parts and liquid fuels ensures a fast operation and high duty-cyclability.

Also, the amount of solid oxygen for operating the propeller is injected into the active layer from the oxygen rich layer operating as a reservoir layer, also in the form of thin film, this allowing a complete reversibility of the propeller and multiple operations. The diffusion of oxygen from the reservoir to the active part is also electrically driven.

In the apparatus described, the process of manufacturing of the thruster only requires standard thin film technology and MEMS processes. A typical cell size containing four thrusters is 1 μm<w≈h<1 mm, this making the thruster applicable for the controlled propulsion of pico- and femto-satellites.

The apparatus described includes a nozzle, carved from the active layer using standard MEMS processing, so that, instead of generating an oxygen bubble trapped between the active layer and the top electrode, the expelled gas is free to expand in such a nozzle. The active area of the nozzle is also extremely small: 100 nm<w≈h<100 μm.

The apparatus described, being completely solid state and electrically operated, is superior to other propulsion techniques in terms of operational safety, stability and reliability. Also the high number of cycles that the resistive hysteresis device architecture may withstand makes it probably the thruster with the longest lifetime ever conceived, also able to operate in pulsed mode. Furthermore voltage operated resistive hysteresis devices allow the careful control of the thrust, enabling a full range of oxygen amounts jetted by the device. The powering of the device requires a warm up phase extremely simple, without any critical valve or fluidic circuit. Similarly, switching off the device may be accomplished by dropping the voltage; in terms of reliability an eventual power loss in the main systems cannot damage the thruster. Its figures of merit show the highest thrust to weight ratio ever conceived, a very high specific impulse, with a remarkably low minimum power/thrust ratio. Furthermore, the efficiency, specific impulse and thrust of the thruster may be increased by means of an electrical/magnetic acceleration stage of expelled ions.

Of course, without prejudice to the principle of the embodiments, the details of construction and the embodiments may vary widely with respect to what has been described and illustrated herein purely by way of example, without thereby departing from the scope of the present embodiments, as defined the ensuing claims.

The apparatus could be further developed by including a secondary acceleration stage, based on either electrical or magnetic fields, or even both of them, since oxygen ions are both electrically charged and have unbalanced magnetic momentum (spin).

The invention claimed is:

1. A propulsion apparatus for a space vehicle, comprising:
   a thruster comprising a solid state oxygen-rich source layer,
   means for extracting oxygen ions from said solid state oxygen-rich source layer,
   means for accelerating correspondingly extracted oxygen ions into vacuum, and
   a stack including said solid state oxygen-rich source layer, an active layer being deposited above said solid state oxygen-rich source layer, in contact with said solid state oxygen-rich source layer, said active layer being formed with a material different from said solid state oxygen-rich source layer, said material being an oxide presenting impedance hysteresis behavior.

2. The apparatus according to claim 1, wherein said material is an oxide presenting impedance hysteresis behavior wherein in a low resistance state (LRS) oxygen ions are expelled through the active layer and wherein in a high resistance state (HRS) the active layer ceases expelling oxygen ions.

3. The apparatus according to claim 1 wherein said active material is located between two metallic layers, an intermediate metallic layer of the two metallic layers arranged on the solid state oxygen-rich source layer and a top metallic layer of the two metallic layers arranged on the active layer.

4. The apparatus according to claim 3, wherein said intermediate metallic layer and said top metallic layer comprise a plurality of parallel strips, the strips of the intermediate metallic layer being arranged orthogonal to the strips of the top metallic layer.

5. The apparatus according to claim 4, wherein said strips of said intermediate metallic layer and said top metallic layer, arranged orthogonal, form crossings and comprise respective passing bores obtained at one or more of said crossing, forming an output duct for oxygen ions emitted by the active layer.

6. The apparatus according to claim 3 further comprising nozzles placed above the bores of the top metallic layer.

7. The apparatus according to claim 1, further comprising an ion accelerating element placed above the nozzles.

8. The apparatus according to claim 1, further comprising a heating electrode associated to the solid state oxygen-rich source layer.

9. A method for propelling an object in vacuum comprising, using the propulsion apparatus according to claim 1 to propel the space vehicle.

10. A method according to claim 9, further comprising:
heating the solid state oxygen-rich source layer to diffuse oxygen into the active layer for a given time;
generating a series of pulses ($V_r$) at a voltage set level ($V_S$), in order to bring a resistance (R16) of the active layer in a low resistance state (LRS) and expel oxygen ions through the active layer;
generating a series of pulses at a reset voltage level (VR) to switch back to the high resistance state (HRS) the active layer to cease expelling oxygen ions.

11. A manufacturing process of one or more thrusters of a propulsion apparatus according to claim 1, comprising
depositing a back electrode on a substrate as heating electrode,
then depositing a solid state oxygen-rich source layer over the back electrode,
depositing the intermediate metallization layer above the solid state oxygen-rich source layer,
then depositing the active layer of an oxide which features a memristive behaviour,
subsequently depositing the topmost metallization electrodes with holes in correspondence of crossings with the bottom electrodes,
depositing a sacrificial portion and subsequently etch said sacrificial portion to manufacture expansion nozzles around the holes.

12. The apparatus according to claim 7 wherein the accelerating element comprises an acceleration metallic grid electrically driven.

13. The apparatus according to claim 4 wherein the plurality of strips comprises two strips.

14. The apparatus according to claim 4 wherein the strips are arranged in a crossbar array arrangement.

15. The process of claim 11 wherein the depositing the intermediate metallization layer comprises depositing as bottom electrodes of a Cross-Point Electrode (CPE) system comprising passing holes.

16. The process of claim 11 further including positioning an energy enhancing element above the nozzles.

* * * * *